United States Patent
Komiya

(10) Patent No.: US 6,344,978 B1
(45) Date of Patent: *Feb. 5, 2002

(54) SHIELD CASE INCLUDING A MATERIAL GIVING A LARGE TRANSMISSION LOSS TO A RADIO FREQUENCY SIGNAL

(75) Inventor: Hiroshi Komiya, Gyoda (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/058,985

(22) Filed: Apr. 13, 1998

(30) Foreign Application Priority Data

Apr. 11, 1997 (JP) .............................. 9-093328

(51) Int. Cl.[7] ................................. H05K 9/00
(52) U.S. Cl. ...................... 361/816; 361/800; 361/818; 174/35 R; 174/35 MS; 333/12; 334/85
(58) Field of Search ................................. 361/728, 736, 361/752, 799, 800, 816, 818; 174/35 R, 35 GC, 35 MS, 32; 333/12, 81 R, 81 A, 181; 439/607–610; 206/719; 334/85

(56) References Cited

U.S. PATENT DOCUMENTS

| | | | |
|---|---|---|---|
| 4,751,479 A | * | 6/1988 | Parr .............................. 333/12 |
| 4,983,932 A | * | 1/1991 | Kitagawa ...................... 333/12 |
| 5,170,142 A | * | 12/1992 | Bier ............................ 333/245 |
| 5,287,074 A | * | 2/1994 | Meguro et al. ................. 333/12 |
| 5,343,184 A | * | 8/1994 | Matsui et al. ................... 333/12 |
| 5,463,014 A | * | 10/1995 | Epstein et al. ............... 528/210 |
| 5,557,074 A | * | 9/1996 | Miyamoto et al. ... 174/152 GM |
| 5,783,772 A | * | 7/1998 | Takahashi et al. ............. 333/12 |

FOREIGN PATENT DOCUMENTS

AU    B-44083/89    *   4/1990

* cited by examiner

Primary Examiner—Jayprakash N. Gandhi
(74) Attorney, Agent, or Firm—Staas & Halsey LLP

(57) ABSTRACT

A shield case which is capable of significantly reducing the level of spurious radiation which may be emitted out through a through-hole formed in the shield case is provided. A recess 8 a few cm wide and a few mm deep is formed in that portion of the interior surface of the shield case 2 surrounding the through-hole 6. A material providing a resistance to the flow of radio frequency current 7 passing through a printed circuit board 1, that is, a material 9 giving a significant transmission loss to a radio frequency signal is embedded in the recess 8 to prevent the radio frequency current passing through the printed circuit board 1 from flowing into the through-hole 6. In addition, such material 9 giving a significant transmission loss is deposited on the inner peripheral surface of the through-hole to inhibit the radio frequency current 7 from flowing through the through-hole.

12 Claims, 4 Drawing Sheets

SHIELD CASE INCLUDING A MATERIAL GIVING A LARGE TRANSMISSION LOSS TO A RADIO FREQUENCY SIGNAL

BACKGROUND OF THE INVENTION

1. Field of the Invention

The present invention relates generally to a shield case for electromagnetically shielding a radio frequency or high frequency circuit, and, more particularly, to such shield case of the type having through-hole means in which connecting means such as a connector is to be mounted.

2. Description of the Related Art

A radio frequency circuit is used in electronic apparatus or devices and electronic instruments handling radio frequency or high frequency signals such as a spectrum analyzer for measuring distributions of the components of various frequencies of an input signal as well as a signal generator comprising a high-frequency power supply used for adjustment, testing and the like of radio receivers, high-frequency amplifiers or the like. Generally, the high frequency circuit of the type concerned is either formed in a printed circuit board or mounted in a printed circuit board as a semiconductor integrated circuit (IC). Typically, a printed circuit board on which a high frequency current exceeding 1 GHz flows is housed in a shield case in order to prevent spurious radiation from being emitted out from the printed circuit board.

FIG. 3 illustrates an example of the prior art shield case of the type described herein. The illustrated shield case 2 comprises an open-topped shield case body 2b which is typically of generally rectangular shape in a plan view approximately analogous to that of a printed circuit board 1 accommodated therein, and a shield cover 2a for closing the open top of the shield case body 2b. Once the printed circuit board 1 has been housed in the shield case, the shield cover 2a is secured to the open top of the shield case body 2b by fastening means such as screws to electromagnetically completely shield the interior of the case.

In this example, the printed circuit board 1 has a signal source 1a mounted thereon for generating various high frequency signals with the connection between the printed circuit board 1 and an external circuitry or equipment being made by feed-through capacitors 3 in the illustrated example. Specifically, the central conductors 31 of these capacitors 3 are used as feed-through terminals to connect the printed circuit board 1 with the external circuitry or equipment 32 to transmit and receive signals (mainly control signals) therebetween.

In modern technology, it may be required to connect as many transmission lines (wires or cables) as several tens for control signals and other signals with the printed circuit board 1 enclosed in the shield case 2 since the radio frequency (RF) circuit requires numerous control signals for the various switches and digital-analog converters (D/A converters) used in that circuit. However, it is difficult due to the limited space to dispose so many feed-through capacitors 3 or feed-through terminals in the bottom wall or side walls of the shield case 2, and if it were feasible, it would involve a very high cost and would be objectionable in terms of cost.

In an attempt to overcome this problem, it has been proposed by the inventor as an alternative approach as illustrated in FIG. 4 to connect several tens of signal transmission lines 52 with the connector 5 and to form the bottom wall of the shield case 2 in this example with a through-hole 6 (which is usually in the form of a slit or slot as the connector of this type is thin in thickness) through which the connector 5 is to be inserted and plug the connector 5 in a connector socket 52 disposed in the printed circuit board 1.

However, it is to be appreciated that with such through-hole 6 for mounting the connector 5 formed through the shield case 2, that portion of the case formed with the hole 6 would not be electromagnetically shielded, so that the bottom wall of the shield case 2 would have an effectively open slit 6 having a length of a few cm. As a consequence, the shield case 2 would act as a slot antenna with a cavity resonator, resulting in intensifying a specific frequency and radiating it to the outside. That is, a spurious radiation with an enhanced level is emitted out through the slit 6 to the exterior of the shield case to deleteriously affect the surrounding equipment and circuits.

Inability to suppress such spurious radiation has heretofore made it impossible to connect the printed circuit board 1 accommodated in the interior of the shield case and having a radio frequency current higher than 1 GHz passing therethrough with the external equipment or circuitry by means of the connector 5 having a multiplicity of signal transmission lines connected therewith.

SUMMARY OF THE INVENTION

It is an object of the present invention to provide a shield case which is capable of significantly reducing the level of spurious radiation which may be emitted out through a through-hole formed in the shield case for mounting connecting means such as connector means therein.

According to the present invention, the foregoing object is accomplished by providing a shield case having a through-hole formed therethrough in which a material giving a large transmission loss to a radio frequency signal passing therethrough is applied to such a surrounding area portion of the interior surface of the shield case as surrounding the through-hole as well as to the inner peripheral surface of the through-hole.

In a preferred embodiment of the invention, the material giving a large transmission loss to a radio frequency signal applied to the surrounding area portion of the interior surface of the shield case surrounding the through-hole is contiguous with the material giving a large transmission loss to a radio frequency signal applied to the inner peripheral surface of the through-hole.

Preferably, the surrounding area portion of the interior surface of the shield case surrounding the through-hole is formed with a recess in which the material giving a large transmission loss to a radio frequency signal is embedded.

In a specific embodiment of the invention, the shield case 2 has accommodated therein a printed circuit board 1 having a radio frequency circuit 1a, a connector being inserted in the through-hole 6 for connection with a connector socket 52 disposed in the printed circuit board, the connector having a multiplicity of signal transmission lines 51 connected therewith for electrically connecting the printed circuit board 1 and an external equipment or circuitry 32. (See FIG. 1A).

DETAILED DESCRIPTION OF THE PREFERRED EMBODIMENTS

Figure 3:
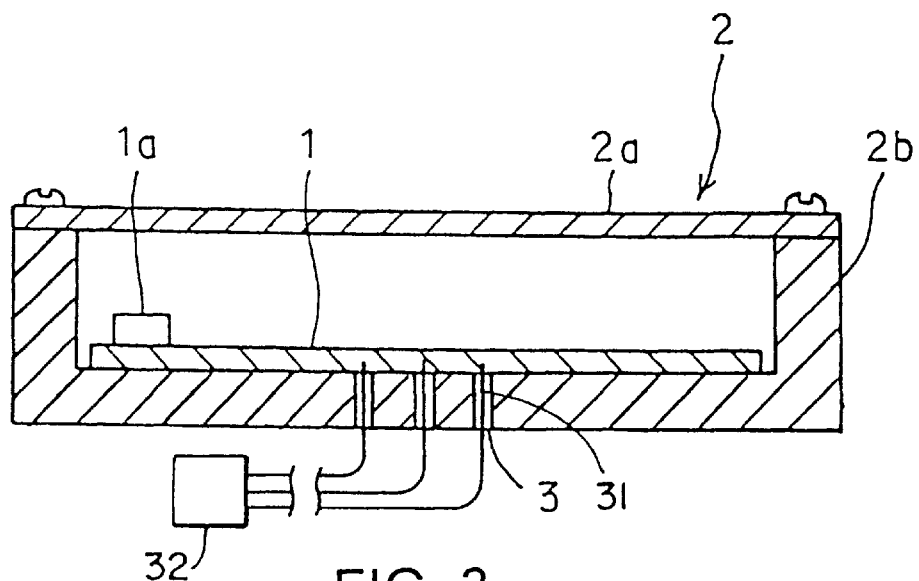
FIG. 3 is a cross-sectional view illustrating one example of the prior art shield case.
Figure 4:
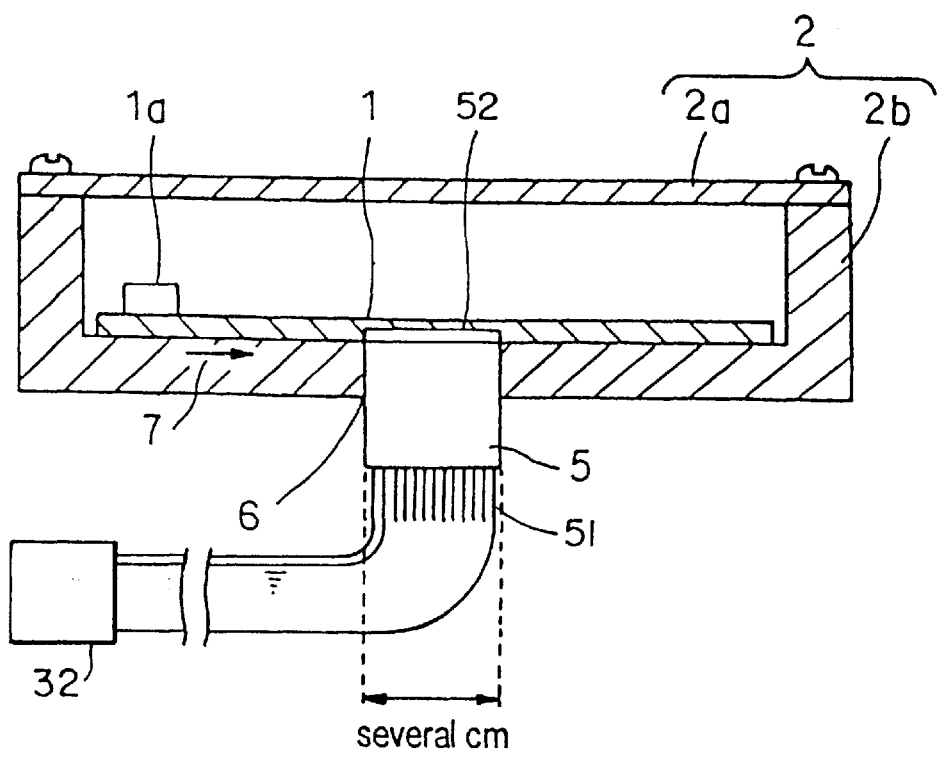
FIG. 4 is a cross-sectional view illustrating another example of the alternatively proposed shield case.

One embodiment of the present invention will be described in details with reference to FIG. 1. In FIG. 1, corresponding reference numerals are used for those parts and elements which correspond to those shown in FIGS. 3 and 4 and those parts and elements will not be discussed again unless necessary.

As discussed hereinabove, in the case the printed circuit board 1 is housed in teh shield case 2 to be electromagnetically shielded in order to prevent spurious radiation from being emitted from the radio frequency circuit of the printed circuit board 1, if the bottom or side wall of the shield case 2 is formed with a through-hole 6 for mounting therein the connector 5 or other connecting means having a multiplicity of signal transmission lines 51 connected therewith, that portion of the case formed with the hole 6 would not be electromagnetically shielded, so that the bottom or side wall of the shield case 2 would have an effectively open slit 6 having a length of a few cm, resulting in the shield case 2 acting as a slot antenna. As a consequence, a specific frequency having a resonance wavelength $\lambda$, $\lambda/2$, $\lambda/4$, . . . equal in length to that of this slot or slit would be intensified to produce spurious radiation.

Figure 5:
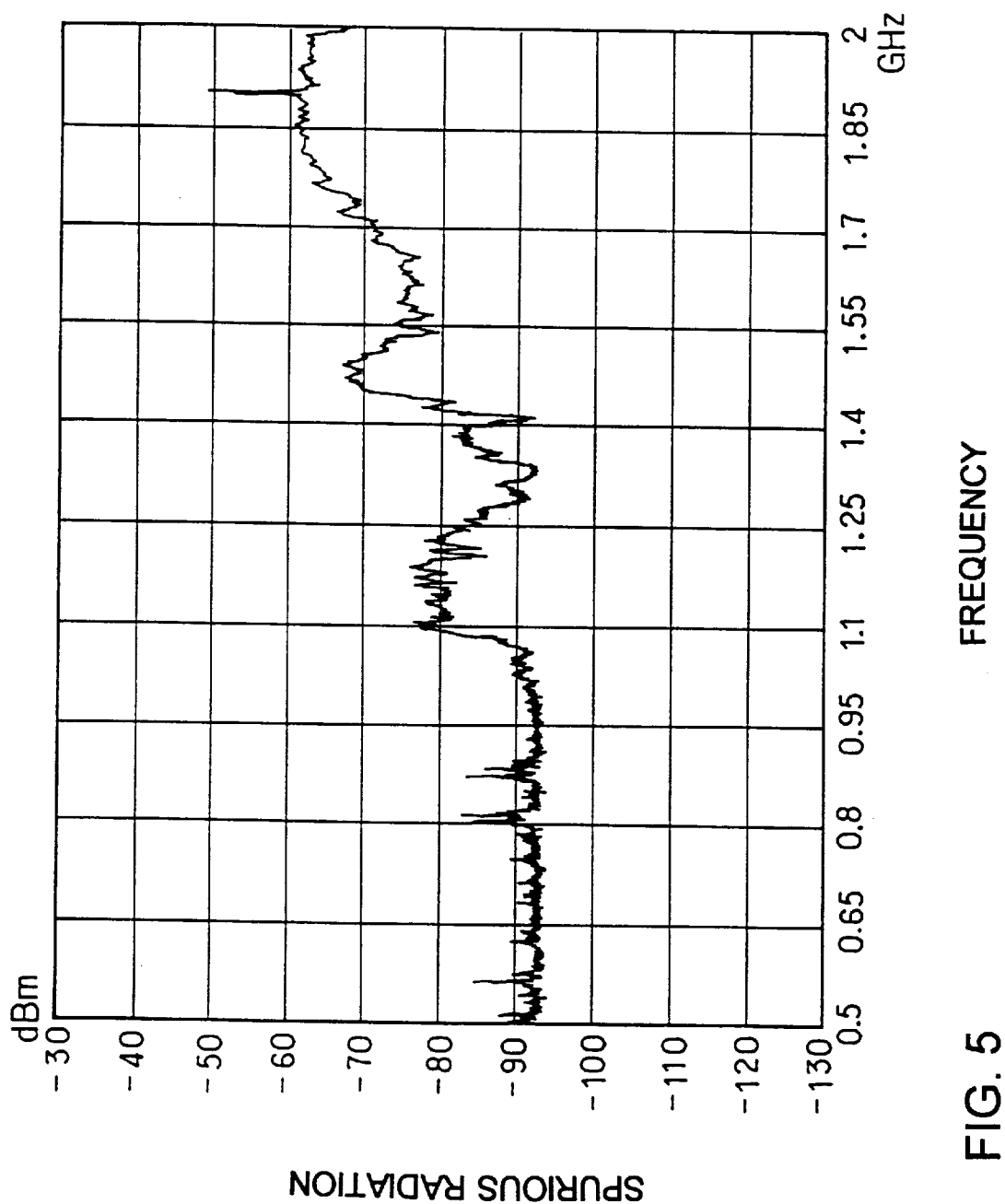
FIG. 5 illustrates the frequency characteristics of the spurious radiation level in the case of the alternatively proposed shield case.

Assuming, for instance, that the through-hole or slit 6 has a length (a length in left-to-right or horizontal direction in FIG. 1B) of about 3.5 cm and a width (a length in up-to-down or vertical direction in FIG. 1B) of about 1.0 cm and that the wavelength resonating with that length 3.5 cm of slit is $\lambda/4$, a significant spurious radiation would occur at frequencies near about 2 GHz as will be determined from the equation $f=C/\lambda$ (where f is frequency, C is velocity of light and $\lambda$ is wavelength). FIG. 5 illustrates the frequency characteristics of the spurious radiation level in the case of the alternatively shield case 2 shown in FIG. 4 wherein the bottom wall of the case is formed with a slit 6 of about 3.5 cm in length and about 1.0 cm in width. It is apparent from this graph that a significant spurious radiation will occur at frequencies in the range from about 1.8 GHz to about 2 GHz.

In order to noticeably reduce such spurious radiation, it is required to reduce the effect of slot antenna of the shield case 2 due to the through-hole 6. In this regard, radio frequency current 7 passing through the radio frequency circuit (the signal source 1a in this example) of the printed circuit board 1 will flow through the surfaces of the printed circuit board 1 and the shield case 2.

Figure 1A:
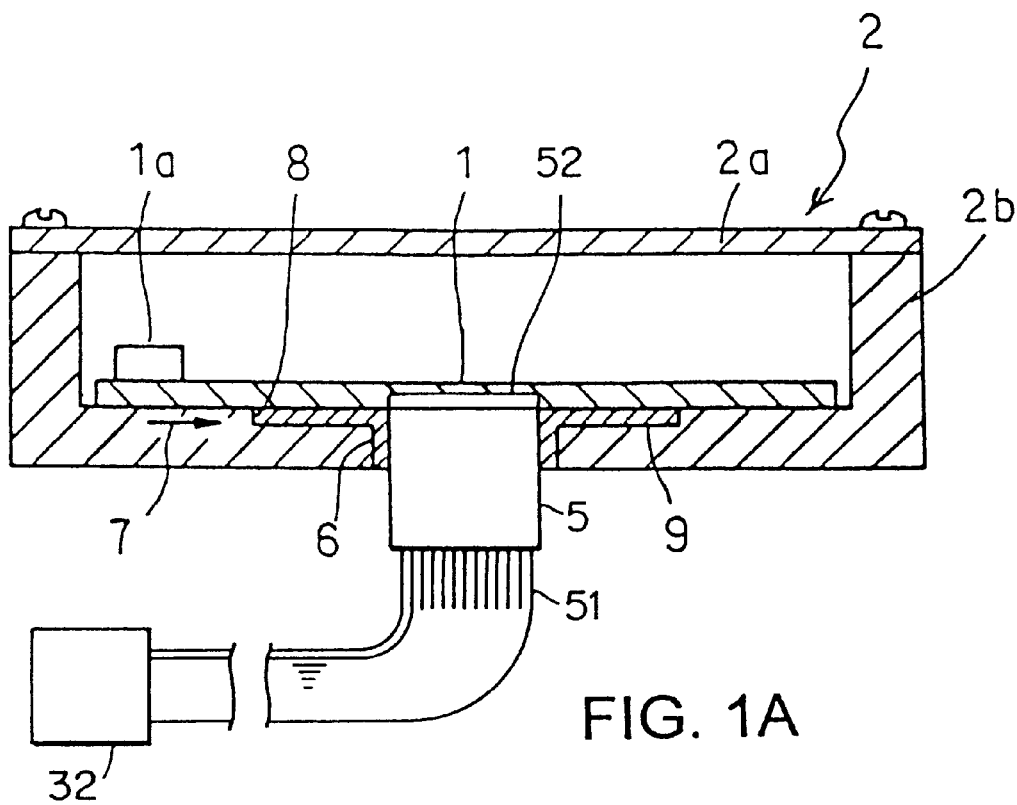
FIG. 1A is a cross-sectional view showing one embodiment of the shield case according to the present invention with a printed circuit board and a connector.
Figure 1B:
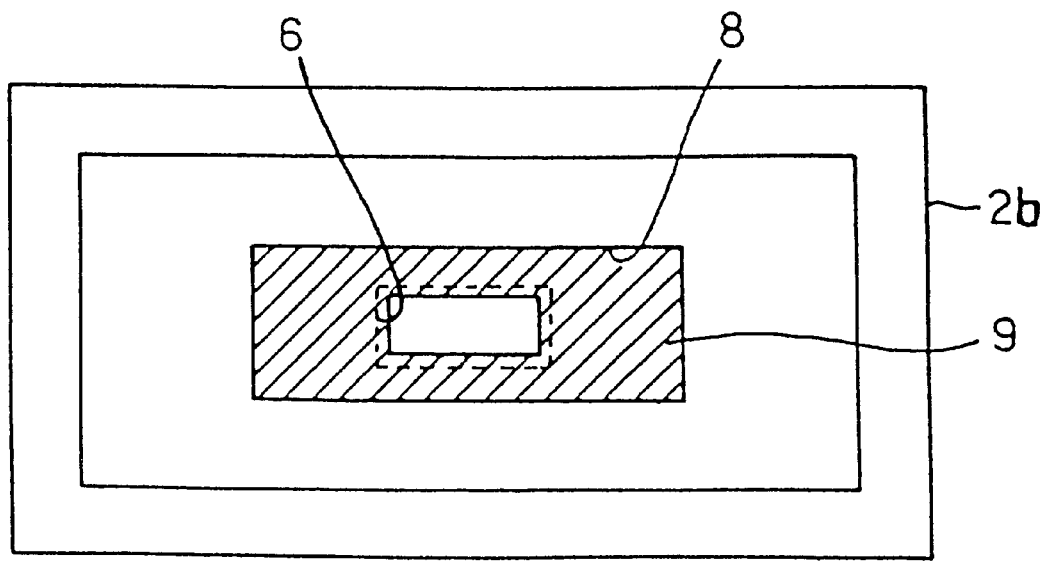
FIG. 1B is a plan view of the shield case shown in FIG. 1A with the shield cover, the printed circuit board and the connector removed to illustrate the interior of the case.

In one embodiment of the present invention, as shown in FIGS. 1A and 1B, a material providing a resistance to the flow of the radio frequency current 7 passing on the printed circuit board 1, that is, a material 9 giving a significant or large transmission loss to the radio frequency current flowing therethrough is deposited in width of a few cm on such a surrounding area portion of interior surface of the bottom wall of the shield case 2 as surrounding the through-hole 6 to inhibit the radio frequency current 7 passing through the printed circuit board 1 from flowing into the through-hole 6. In addition, such material 9 giving a significant transmission loss is deposited on the inner peripheral surface of the through-hole 6 (the cross-sectional portion of the bottom wall of the shield case 2) to inhibit the radio frequency current 7 from flowing through the through-hole 6.

In this case, it is preferable that the material 9 giving a significant transmission loss applied to the surrounding area portion of the interior surface of the shield case surrounding the through-hole 6 be continuously joined with the similar material 9 applied to the inner peripheral surface of the through-hole 6, since such continuity contributes to further inhibiting the flow of the radio frequency current. In addition, as will be appreciated from FIG. 1A, it is preferable that the surrounding area portion of the interior surface of the shield case 2 surrounding the through-hole 6 is formed with a recess 8 a few cm wide and a few mm deep in which the material 9 giving a significant transmission loss is embedded, because such arrangement permits closer contact of the material 9 with the bottom surface of the printed circuit board 1, whereby the radio frequency current passing through the bottom surface of the printed circuit board 1 may be effectively suppressed while at the same time the radio frequency current passing through the interior surface of the bottom wall of the shield case 2 may be more effectively inhibited. Preferably, the exposed top surface of the embedded layer of the material 9 is flush with the rest of the interior surface other than that of the surrounding area portion of the bottom wall of the shield case 2.

In the illustrated embodiment, the through-hole 6 is a slit 6 of about 35 mm in length (a length in left-to-right direction in FIG. 1B) and about 10 mm in width (a length in up-to-down direction in FIG. 1B), and the material 9 giving a significant transmission loss to a radio frequency signal is deposited on such a surrounding area portion of the interior surface of the shield case 2 as surrounding the through-hole 6 which is centrally positioned in that portion as well as on the inner peripheral surface of the through-hole 6. The material 9 giving a significant transmission loss deposited on the surrounding area portion of the interior surface of the shield case 2 surrounding the through-hole 6 extends to 75 mm in length and 40 mm in width. In addition, the depth of the recess 8 is 1 mm and hence the thickness of the material 9 giving a significant transmission loss embedded therein is also 1 mm. The thickness of the material 9 giving a significant transmission loss deposited on the inner peripheral surface of the through hole 6 is also 1 mm.

In the illustrated embodiment, it is noted from FIG. 1B that the area of material 9 giving a significant transmission loss is greater in the left-to-right width than the top-to-bottom width as viewed in the drawing. This is because the signal source 1a which is a source of radio frequency current is mounted on the rectangular printed circuit board 1 adjacent one end (left end as viewed in the drawing) thereof. It is to be understood that the present invention is not limited to the illustrated arrangement. In other words, it will be apparent that the width of the material 9 giving a significant transmission loss and the depth of the recess 8 may vary depending on the printed circuit board 1 to be accommodated in the shield case 2.

Materials providing a resistance to the flow of radio frequency current, that is, materials 9 giving a significant transmission loss useful in the present invention may include radio absorbers and materials having a high dielectric loss. Dielectric loss is expressed by the following equation:

$$\text{dielectric loss} = k \cdot f \cdot \sqrt{\varepsilon} \cdot \tan\delta$$

where δ is relative permittivity, f is frequency, tan 6 is dielectric loss tangent, and k is a constant.

It is thus to be understood that a material having a high dielectric loss is a material having very high relative permittivity and dielectric loss tangent.

Figure 2:
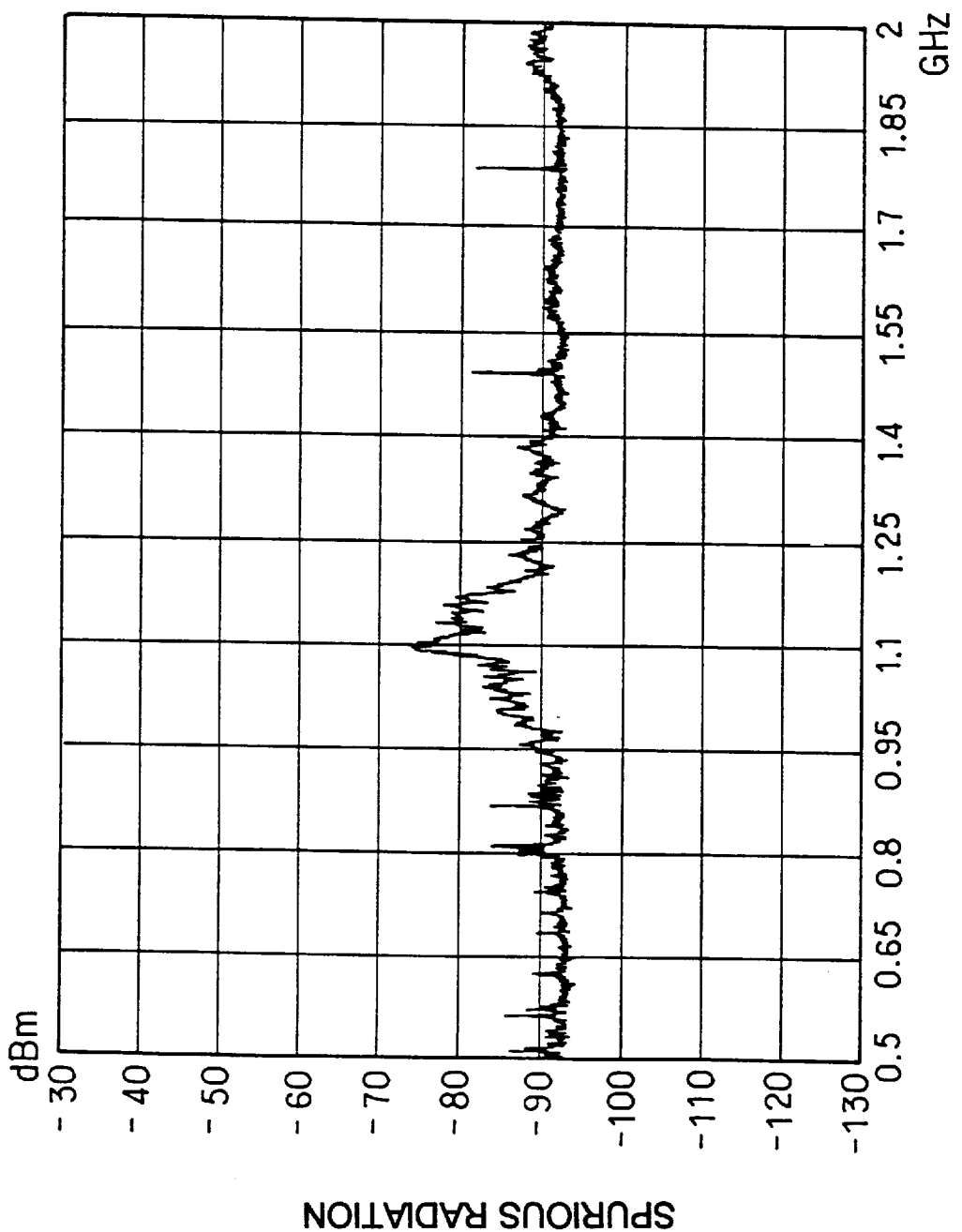
FIG. 2 illustrates the frequency characteristics of the spurious radiation level in the case of the shield case according to the present invention.

In the illustrated embodiment, the material available under the trade name "Fil Tek Nova EM-200" from Japan Paint Co., Ltd. (which is relatively pliable and in the form of sheet a few mm thick) was used a material 9 having a high dielectric loss, and bonded by adhesive to the recess 8 and the inner peripheral surface of the through-hole 6. As a result, as is evident from FIG. 2, it was found that this configuration realized a noticeable reduction in the level of spurious radiation at frequencies in the range from about 1.5 GHz to about 2 GHz as compared with the alternatively proposed shield case. Particularly at frequencies in the range from about 1.8 GHz to about 2 GHz, spurious radiation was reduced by about no less than 20 dB than with the previously proposed shield case.

While in the illustrated embodiment the present invention has been described with respect to the case where the invention is applied to the shield case 2 having formed in the bottom wall thereof a through-hole 6 in a shape of a slit for mounting a connector therein, it is understood by those skilled in the art that the invention is equally applicable to the shield case 2 having formed in the side wall thereof a through-hole 6 for mounting a connector therein. It is also apparent that the present invention is applicable with similar functional advantages to the shield case 2 having formed in either the bottom wall or the side wall thereof a through-hole (slit) 6 for mounting connecting means other than the connector described herein.

As is apparent from the foregoing description, according to the present invention, a material giving a large or significant transmission loss to a radio frequency signal passing therethrough is deposited on that portion of the interior surface of the shield case surrounding the through-hole and on the inner peripheral surface of the through-hole, whereby a radio frequency current flowing across the interior surface of the shield case as well as a radio frequency current emitting out through the through-hole are greatly reduced by the material giving a large transmission loss. Consequently, the level of spurious radiation emitted out through the through-hole may be appreciably reduced as compared with the prior art, thereby emaciating the possibility of deleteriously affecting the surrounding circuit. It is thus to be appreciated that the present invention provides the remarkable advantage of permitting a through-hole to be formed through the wall of the shield case for mounting a connector or other connecting means having a multiplicity of signal transmission lines connected therewith.

What is claimed is:

1. A shield case having a single through-hole formed in a flat plate portion of said shield case, wherein a material giving a large transmission loss to a radio frequency signal is applied to a surrounding area portion of interior surface of the flat plate portion of said shield case surrounding said through-hole as well as to the inner peripheral surface of said through-hole to thereby obtain layers of said material having a certain width and a certain thickness on the surrounding area portion as well as on the inner peripheral surface whereby suppressing undesirable spurious radiation of a specific frequency range caused by a slot antenna due to said through-hole to thereby allow connector means to be provided through said through-hole.

2. The shield case according to claim 1 wherein, said layer of said material giving large transmission loss applied to the surrounding area portion of the interior surface of the flat plate portion of said shield case surrounding said through-hole is continuously joined with said layer of said material giving a large transmission loss applied to the inner peripheral surface of said through-hole.

3. The shield case according to claim 1 wherein the surrounding area portion of the interior surface of the flat plate portion of said shield case surrounding said through-hole is formed with a recess in which said material giving a large transmission loss is embedded.

4. The shield case according to claim 1 wherein said shield case has accommodated therein a printed circuit board having a radio frequency circuit, a connector being inserted in said through-hole for connection with a connector socket disposed in said printed circuit board, said connector having a multiplicity of signal transmission lines connected therewith for electrically connecting said printed circuit board and an external equipment.

5. A shield case enclosing electric equipment operable with a radio frequency signal preventing leakage of the radio frequency signal out of the shield case comprising:

a conductor case body formed in a closed housing in which said electric equipment is enclosed to be electromagnetically shielded from outside, said conductor case body having a conductor flat plate portion in which a single through-hole is formed, said through-hole an opening area which is relatively larger than those of a multiplicity of signal transmission lines usable for connecting said electric equipment enclosed in said case body to outside, so that said shield case may form a slot antenna capable of emitting a specific spurious radiation due to the through-hole; and leakage preventing layers formed of a material having such a characteristic as to give a large transmission loss to the radio frequency signal and provided on interior surface of said conductor flat plate portion of said case body at a surrounding area portion surrounding said through-hole as well as on inner peripheral surface of said through-hole, whereby a single connector means equipped with a multiplicity of signal transmission lines for connecting said electric equipment to the outside is allowed to be mounted through said through-hole.

6. The shield case according to claim 5 wherein said leakage preventing layer provided at the surrounding area portion on the interior surface of said conductor flat plate portion surrounding said through-hole and the leakage preventing layer provided on the inner peripheral surface of said through-hole are integrally formed to each other.

7. The shield case according to claim 5 wherein the surrounding area portion on the interior surface of said conductor flat plate portion surrounding said through-hole is formed with a recess in which said leakage preventing layer is embedded in such a manner that top surface of the leakage preventing layer thus embedded becomes flush with the interior surface of remaining area portion other than the surrounding area portion of the flat plate portion of the case body.

8. The shield case according to claim 5 wherein said electric equipment enclosed in said conductor body comprises a printed circuit board disposed thereon with a connector socket to which said connector means is coupled, said connector means having the multiplicity of signal transmission lines electrically connects said printed circuit board to the outside equipment, said opening area of said through-hole has such a shape as said connector is allowed to pass therethrough and to be mounted thereto, and said printed circuit board at its bottom surface is closely contacted with the interior surface of the conductor flat plate portion of said conductor case body.

9. The shield case according to claim 8 wherein the interior surface of said conductor plate portion at the surrounding area thereof is formed with a recess in which said leakage preventing layer is embedded such that an exposed top surface of the thus embedded leakage preventing layer is flush with the interior surface of the conductor plate portion at the rest of the surrounding area portion thereof, so that the bottom surface of the printed circuit board is closely contacted with the interior surface of the conductor plate portion and the exposed top surface of the embedded leakage preventing layer.

10. The shield case according to claim 9 wherein a depth of said recess is selected to be up to approximately 1 mm.

11. A shield case having a single through-hole in a shape of a slot formed through a flat plate of the shield case, said case comprising:

an interior surface of said flat plate;

an inner peripheral surface of said through-hole;

a layer of a material giving a large transmission loss to a radio frequency signal which is formed on a portion of the interior surface surrounding said through-hole; and a layer of said material which is formed on the inner peripheral surface of said through-hole.

12. A conductor shield case of a closed shape comprising:

a flat plane portion in which a single through-hole of a shape of a slot is formed for mounting therethrough a connector which is equipped with multiple signal transmission lines, said flat plane portion having an interior surface, and said through-hole having an inner peripheral surface; and leakage preventing layers formed of a material giving a large transmission loss to a radio frequency signal, said layer being applied on a surrounding area portion of a predetermined area of the interior surface surrounding said through-hole and on all the inner peripheral surface of said through-hole.

\* \* \* \* \*